United States Patent [19]
Ding et al.

[11] Patent Number: 5,981,145
[45] Date of Patent: Nov. 9, 1999

[54] LIGHT ABSORBING POLYMERS

[75] Inventors: Shuji Ding, Branchburg; Dinesh N. Khanna, Flemington; Ping-Hung Lu, Bridgewater; Jianhui Shan, High Bridge; Ralph R. Dammel, Flemington; Dana L. Durham, Flemington; M. Dalil Rahman, Flemington; Iain McCulloch, Basking Ridge, all of N.J.

[73] Assignee: Clariant Finance (BVI) Limited, Virgin Islands (Br.)

[21] Appl. No.: 08/846,986

[22] Filed: Apr. 30, 1997

[51] Int. Cl.$^6$ ................... C08F 8/30; G08F 7/11; G08F 7/09
[52] U.S. Cl. ............... 430/271.1; 525/376; 525/333.6; 525/327.7; 525/331.3; 525/329.9; 525/328.5; 525/328.2; 526/313; 526/310
[58] Field of Search ............... 525/376, 333.6, 525/327.7, 331.3, 329.9, 318.5, 328.2; 526/313, 310; 430/271.1

[56] References Cited

U.S. PATENT DOCUMENTS

| | | | |
|---|---|---|---|
| 3,625,919 | 12/1971 | Kamogawa et al. | 260/47 U |
| 4,491,628 | 1/1985 | Ito et al. | 430/176 |
| 4,631,328 | 12/1986 | Ringsdorf et al. | 526/259 |
| 5,069,997 | 12/1991 | Schwalm et al. | 430/270.1 |
| 5,207,952 | 5/1993 | Griffin, III | 252/582 |
| 5,227,444 | 7/1993 | Muller et al. | 526/311 |
| 5,294,680 | 3/1994 | Knors et al. | 525/327 |
| 5,350,660 | 9/1994 | Urano et al. | 430/176 |
| 5,384,378 | 1/1995 | Etzbach et al. | 526/256 |
| 5,472,827 | 12/1995 | Ogawa et al. | 430/315 |
| 5,496,899 | 3/1996 | Foll et al. | 525/327 |
| 5,525,457 | 6/1996 | Nemoto et al. | 430/325 |
| 5,652,297 | 7/1997 | McCulloch et al. | 524/555 |
| 5,652,317 | 7/1997 | McCulloch et al. | 526/312 |

FOREIGN PATENT DOCUMENTS

| | | | |
|---|---|---|---|
| 522990 | 1/1993 | European Pat. Off. | G03F 7/09 |
| 583205 | 2/1994 | European Pat. Off. | C09B 69/10 |
| 7-153682 | 6/1995 | Japan | H01L 21/027 |
| 7-333855 | 12/1995 | Japan . | |
| 622935 | 5/1949 | United Kingdom . | |
| 1064470 | 4/1967 | United Kingdom . | |
| WO 95/10798 | 4/1995 | WIPO | G03F 7/09 |
| WO 97/07145 | 2/1997 | WIPO . | |
| WO 97/33200 | 9/1997 | WIPO | G03F 7/09 |
| WO 97/33201 | 9/1997 | WIPO | G03F 7/09 |
| WO 98/07070 | 2/1998 | WIPO . | |
| WO 98/07071 | 2/1998 | WIPO . | |

OTHER PUBLICATIONS

JP 59017549 "Photocrosslinking Composition" (Ricoh Co., Ltd., Japan) Application JP 82–126446 Jul. 20, 1982—Abstract only from HCAPLUS file of ACS, 1984:431181.

SPIE vol. 1927, Optical/Laser Microlithography, Mar. 3, 1993, pp. 275–286, "Optimizaion of Anti–reflection Layers for Deep UV Lithography", H. J. Dijkstra et al.

SPIE vol. 2724, Advances in Resist Technology and Processing XIII, Mar. 11, 1996, pp. 754–769, "Modeling of Bottom Anti–reflection Layers: Sensitivity to Optical Constants Photolithography", R. R. Dammel et al.

JP appln 6–128916 (Kokai 7–333855), Mitsubishi Chemical, Nishi et al, Dec. 22, 1995, trans of claims.

Patent Abstracts of Japan, vol. 96, #5, Mar. 31, 1996, & JP 08 017711, Sony Corp., Jan. 19, 1996.

Patent Abstracts of Japan, vol. 12, #489(E–696), Dec. 21, 1988, & JP 63 202915, Oki Electric Ind. Co. Ltd., Aug. 22, 1988.

Patent Abstracts of Japan, vol. 7, #136(E–181), Jun. 14, 1983, & JP 58 051515, Fujitsu KK), Mar. 26, 1983.

SPIE vol. 1466, Advances in Resist Technology and Processing VIII (1991), pp. 297–307, "Optimization of Optical Properties of Resist Processes", T. Brunner.

*Primary Examiner*—Cynthia Hamilton
*Attorney, Agent, or Firm*—Sandya Jain

[57] ABSTRACT

The present invention relates to a novel polymer suitable for use as an antireflective coating or as an additive in photoresist for absorption of reflected light. The novel polymer comprises at least one unit containing a dye that absorbs from about 180 nm to about 450 nm and at least one unit that contains no aromatic funtionality. The polymer is soluble in organic solvents, preferrably solvents of low toxicity, or it may be soluble in water, which may additionally contain other water miscible organic solvents.

7 Claims, No Drawings

LIGHT ABSORBING POLYMERS

BACKGROUND OF THE INVENTION

The present invention relates to a novel light absorbing polymer which may be useful in instances where light absorption is advantageous, particularity in antireflective coating compositions or as light absorbing additives. Antireflective coatings are used in image processing by forming either a thin layer between a reflective substrate and a photoresist coating or as a dyed coating on top of a photoresist. Such compositions are especially useful in the fabrication of semiconductor devices by photolithographic techniques. The polymer may also be used as an additive in photoresists to prevent reflection of light from the substrate.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the minitiarization of semiconductor devices has lead to the use of sophisticated multilevel systems to overcome difficulties associated with such minitiarization. The use of highly absorbing antireflective coatings in photolithography is a simpler approach to diminish the problems that result from back reflection of light from highly reflective substrates. Two deleterious effects of back reflectivity are thin film interference and reflective notching. Thin film interference results in changes in critical linewidth dimensions caused by variations in the total light intensity in the resist film as the thickness of the resist changes. Variations of linewidth are proportional to the swing ratio (S) and therefore must be minimized for better linewidth control. Swing ratio is defined by:

$$S = 4(R_1 R_2)^{1/2} e^{-\alpha D}$$

where $R_1$ is the reflectivity at the resist/air or resist/top coat interface, where $R_2$ is the reflectivity at the resist/substrate interface, where $\alpha$ is the resist optical absorption coefficient, and D is the film thickness.

Bottom antireflective coatings function by absorbing the radiation used for exposing the photoresist, thus reducing $R_2$ and thereby reducing the swing ratio. Reflective notching becomes severe as the photoresist is patterned over substrates containing topographical features, which scatter light through the photoresist film, leading to linewidth variations, and in the extreme case, forming regions with complete resist loss. Similarily, dyed top antireflective coatings reduce the swing ratio by reducing $R_1$, where the coating has the optimal values for refractive index and absorption characteristics, such as absorbing wavelength and intensity.

In the past dyed photoresists have been utilized to solve these reflectivity problems. However, it is generally known that dyed resists only reduce reflectivity from the substrate but do not substantially eliminate it. In addition, dyed resists also cause reduction in the lithographic performance of the photoresist, together with possible sublimation of the dye and incompatibility of the dye in resist films. In cases where further reduction or elimination of the swing ratio is required, the use of a top or bottom antireflective coating provides the best solution for reflectivity. The bottom antireflective coating is applied to the substrate prior to coating with the photoresist and prior to exposure. The resist is exposed imagewise and developed. The antireflective coating in the exposed area is then etched, typically in an oxygen plasma, and the resist pattern is thus transferred to the substrate. The etch rate of the antireflective film should be relatively high in comparison to the photoresist so that the antireflective film is etched without excessive loss of the resist film during the etch process. The top antireflective coating is applied on top of a film of photoresist. The system is then imagewise exposed and developed to give a pattern on the substrate. Top antireflective coatings are disclosed in EP 522,990, JP 7,153,682, JP 7,333,855 and in pending patent application with U.S. Ser. No. 08/811,807 filed on Mar. 6, 1997, based on provisional application 60/013,007 filed on Mar. 7, 1996, now abandoned, and all incorporated herein by reference.

Antireflective coatings containing a dye for absorption of the light and an organic polymer to give coating properties are known. However, the possibility of sublimation and diffusion of the dye into the environment and into the photoresist layer during heating make these types of antireflective compositions undesirable.

Polymeric organic antireflective coatings are known in the art as described in EP 583,205, and incorporated herein by reference. However, the antireflective films as disclosed in EP 583,205 are cast from organic solvents, such as cyclohexanone and cyclopentanone. The potential hazards of working with such organic solvents, have lead to the development of the antireflective coating composition of the instant invention, where the solid components of the antireflective coating are both soluble and spin castable from solvents having lesser toxicity hazards. The preferred solvents that are known in the semiconductor industry to have low toxicity among others are propylene gycol monomethyl etheracetate (PGMEA), propylene gycol monomethylether (PGME), and ethyl lactate (EL). An even more preferred solvent is water for its ease of handling and transportation. The antireflective coating of the present invention can be cast from these low toxicity solvents, water, or mixtures of water and lower alcohols, ketones or esters that are miscible in water. Antireflective coatings are also disclosed in U.S. Pat. No. 5,525,457 and in pending patent applications with U.S. Ser. Nos. 08/698,742 filed on Aug. 16, 1996, 08/699, 001 filed on Aug. 16, 1996, and 08/724,109 filed on Sep. 30, 1996, and all incorporated herein by reference. However, the novel dye functionality of the instant invention when attached to the specific types of monomer described, makes the instant invention significantly different from the prior art referred to previously. Another advantage of using antireflective coatings soluble in the prefered, lower toxicity solvents, is that these same solvents can also be used to remove the edge bead of the antireflective coating and no additional hazards or equipment expense is incurred, since these solvents are also used for photoresist and photoresist processing. The antireflective coating composition also has good solution stability. Additionally, substantially no intermixing is present between the antireflective coating and the photoresist film. The antireflective coating also has good dry etching properties, which enable a good image transfer from the resist to the substrate and good absorption characteristics to prevent reflective notching and linewidth variations.

SUMMARY OF THE INVENTION

The present invention relates to a novel polymer suitable for use as an antireflective coating in photolithography or as additive for photoresists. The novel polymer of the composition comprises at least one unit with a dye functionality and at least one unit without an aromatic group. The dye functionality is one that strongly absorbs radiation ranging from about 180 nm (nanometer) to about 450 nm. The polymer of this invention comprises dyed monomeric units that are defined by the following structure:

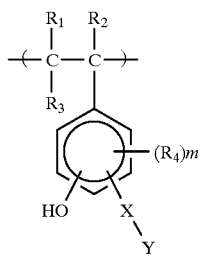

where,

R$_1$–R$_4$ are independently hydrogen, alkyl, alkoxy, halo, cyano, divinylcyano, alkyl ether, aryl, aralkyl, amino, hydroxy, fluoroalkyl, nitro, amide, alkyl amide, sulfonic acid, sulfonate ester, carboxylic acid, carboxylic ester, alkali salts of carboxylic or sulfonic acids;

X is N=N, R'C=C R', R'C=N or N=C R', where R' is H or alkyl;

Y is aryl, aralkyl, heterocyclic or alkyl;

m=1–3; and at least one nonaromatic comonomer unit of the formula:

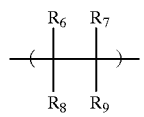

where,

R$_6$–R$_9$ are independently hydrogen, alkyl, alkoxy, halo, alkyl ether, amino, hydroxy, fluoroalkyl, amide, alkyl amide, carboxylic acid, carboxylic ester, sulfonic acid, sulfonic ester, alkali salts of carboxylic acid and sulfonic acid, crosslinking group or R$_8$ and R$_9$ combined to form an anhydride group.

Heterocyclic refers to 5–7 membered rings containing heteroatoms such as oxygen, nitrogen, sulfur or combinations thereof.

The novel polymer is particularly useful since it is soluble in organic solvents, preferably in solvents that are of low toxicity and additionally have good coating and solubility properties. The preferred choice of organic solvents that are well known for having low toxicity and are also useful for dissolving the present polymer are PGME, PGMEA or EL, although other low toxicity solvents can also be used alone or as mixtures. In another embodiment of the invention, by judicious choice of substituents and for comonomers, the novel polymer is preferably soluble in water or mixtures of water and lower alcohols, ketones or esters that are miscible in water.

DESCRIPTION OF THE INVENTION

The polymer of the present invention, which may be suitable for use as an antireflective film or as an additive in photoresists, comprises at least one unit containing a dye functionality and at least one other unit that does not contain an aromatic group, and where the polymer thus obtained strongly absorbs ultraviolet light having a wavelength in the range of 180 nm to about 450 nm.

The preferred types of dyed monomeric units that can be used are defined by the following structure:

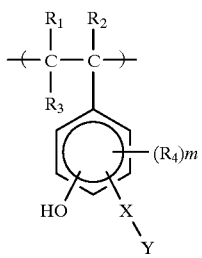

where,

R$_1$–R$_4$ are independently hydrogen, alkyl, alkoxy, halo, cyano, divinylcyano, alkyl ether, aryl, aralkyl, amino, hydroxy, fluoroalkyl, nitro, amide, alkyl amide, sulfonic acid, sulfonate ester, carboxylic acid, carboxylic ester, alkali salts of carboxylic or sulfonic acids;

X is N=N, R'C=C R', R'C=N or N=C R', where R' is H or alkyl;

Y is aryl, aralkyl, heterocyclic or alkyl;

m=1–3.

The chemical structure of the dye chromophore is critical to provide the appropriate absorption, etch characteristics and solubility in the solvents that are of low toxicity, and particularity for aqueous solubility. In this invention the absorption is provided through the X and Y groups being conjugatively attached to the phenolic moeity. X can be selected from the following groups, N=N, R'C=C R', R'C=N or N=C R', where R' is H or alkyl. Y can be any organic group that can be optimally selected to give the desired absorption, etch characteristics, and solubility. Examples of groups that can function as Y are:

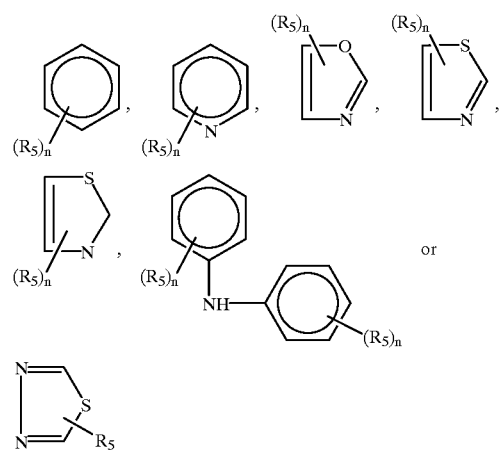

where R$_5$ is independently hydrogen, alkyl, alkoxy, halo, cyano, divinylcyano, alkyl ether, aryl, aralkyl, amino, hydroxy, fluoroalkyl, nitro, ether, amide, alkyl amide, sulfonic acid, sulfonate ester, carboxylic acid, carboxylic ester, alkali salts of carboxylic or sulfonic acids; and n=1–5.

More specifically, dye units can be:

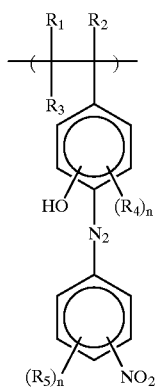

(1)

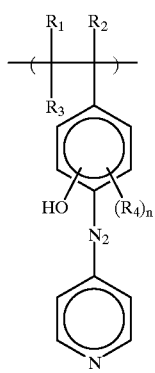

(2)

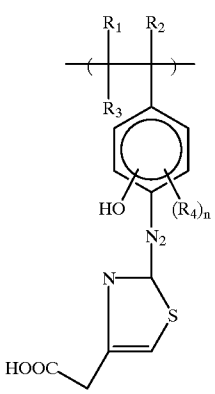

(3)

In the above definitions and throughout the present specification, alkyl means linear and branched alkyl having the desirable number of carbon atoms and valence. Furthermore, alkyl also includes aliphatic cyclic groups, which may be monocyclic, bicyclic, tricyclic and so on. Suitable linear alkyl groups include methyl, ethyl, propyl, butyl, pentyl, etc.; branched alkyl groups include isopropyl, iso or tert butyl, branched pentyl, hexyl, octyl, etc; monocyclic or multicyclic alkyl groups may also be used. Furthermore, $R_4$, could be a cyclic ring fused to the phenyl moiety, where derivatives of tetralin are an example of such a system. As mentioned herein the cyclic alkyl groups may be substituted with groups such as alkyl, alkoxy, ester, hydroxyl or halo groups.

Other alkyl substituents envisioned as being within the scope of this invention are divalent groups such as methylene, 1,1- or 1,2-ethylene, 1,1-, 1,2-, or 1,3 propylene and so on; a divalent cyclic alkyl group may be 1,2- or 1,3-cyclopentylene, 1,2-, 1,3-, or 1,4-cyclohexylene, and the like.

Aryl substituents include unsubstituted or alkyl, alkoxy, hydroxyl, ester or halo substituted aryl groups, such as, phenyl, tolyl, bisphenyls, trisphenyls, phenylenes, biphenylenes, naphthalenes, anthracenes, and others. Fluoroalky groups may be linear or branched and can be represented by trifluoromethyl, 1,1,2-trifluoroethyl, pentafluoroethyl, perfluoropropyl, perfluorobutyl, and 1,1,2,3,3-pentafluorobutyl. Alkoxy substituents can include methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, 2-ethyloctyloxy, phenoxy, tolyloxy, xylyloxy, phenylmethoxy, amongst others.

Unless otherwise specified alkyl is $C_1$–$C_5$ alkyl; aryl is 1–3 aromatic rings; halo is chloro- fluoro- or bromo- and carboxylic acid is a $C_1$–$C_5$ alkyl or aryl carboxylic acid.

In addition to the dye monomer, the dyed polymer contains other monomer or monomers that do not have aromatic groups. A large degree of aromaticity is not desirable for antireflective coatings since this increases the etch rate relative to the photoresist and therefore reduces selectivity during the etch process. The polymer, in addition to the dyed monomer, may contain units of the following structure:

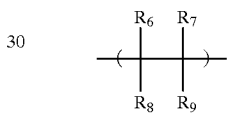

where, $R_6$–$R_9$ are independently hydrogen, alkyl, alkoxy, halo, alkyl ether, amino, hydroxy, fluoroalkyl, amide, alkyl amide, carboxylic acid, carboxylic ester, sulfonic acid, sulfonic ester, alkali salts of carboxylic acid and sulfonic acid, crosslinking group or $R_8$ and $R_9$ combined to form an anhydride group.

Specifically, the polymer may be derived from comonomers that are acrylic acid or its esters, methacrylic acid or its esters, maleic anhydride, vinyl acetate, vinyl ether, acrylamide, vinyl carboxylic acid, vinyl alcohol or vinyl sulphonic acid. One or more of these monomers may be incorporated into the polymer. A particular monomer that can be used is methyl methacrylate. The comonomer chosen could have a crosslinking group that can crosslink the polymer in the presence of an acid, a latent acid or heat. Comonomers with hydrophilic substitiuents, such as acids or their salts, and additional comonomers, such as vinyl ethers, maleic anhydride, fumaric anhydride, vinyl pyrollidones and acrylamides, that promote aqueous solubility may be used. The hydrophilic group can be represented by $O(CH_2)_2$—O—$(CH_2)$—OH, $O(CH_2)_2$—OH, $(CH_2)_n$—OH (where n=1–4), $COO(C_1$–$C_4)$alkyl, COOX, $SO_3$X (where X is H, alkali metal, ammonium or alkyl ammonium), and $CONHCH_2OH$.

The novel polymer may be derived by reacting the dyed monomer with the comonomers or by reacting a copolymer of hydroxystyrene with the appropriate reagent to give the dyed polymer of this invention. As an example poly(4-hydroxystyrene-methyl methacrylate) is reacted with a diazonium compound to give the desired polymer.

The final chemical structure of the dyed polymer is optimized by having those types and ratios of monomeric units that give the desired properties for its intended use. For example, wavelength of absorption, intensity of absorption, solubility characteristics, refractive index, etch characteristics and coating properties are important parameters that effect the performance of antireflective coatings. The wavelength of the polymer of the antireflective coating is matched to that of the irradiation wavelength. Typically, these wavelengths range from 180 nm to 450 nm, preferably, 436 nm and 365 nm for g- and i-line exposures respectively, 248 nm for KrF laser and 193 nm for ArF laser. Broadband exposure units require polymers that absorb over a broad range of wavelengths. A strongly absorbing polymer prevents light from reflecting back into the photoresist and acts as an effective antireflective coating. The choice of comonomers and substituents allows for the refractive index and the absorption wavelength and intensity of the polymer to be optimized to give the minimum back reflection into the photoresist. Furthermore, a strongly absorbing polymer allows for thinner coatings to be used beneath the photoresist, thus resulting in a better image transfer. Solubility of the dyed polymer in solvents of lower toxicity, such as PGMEA, PGME or EL and particularly water, is another very important charateristic of the present invention. Changing the substituents on the polymer can further optimize the solubility characteristics of the polymer.

The process used for polymerization can be any of the ones known in the art for polymerizing vinyl polymers, such as, ionic or free radical polymerization. The polymer structure formed can be composed of alternate, block or random copolymers. The weight average molecular weight of the polymer ranges from about 2,500 to about 1,000,000.

The mole % of the dye containing monomer can range from about 5 to 90, and the mole % of the comonomer or comonomers can range from about 10 to about 95 in the final polymer. Additionally, the polymer may contain unreacted precursors and/or monomers from the synthetic steps of the preparation of the polymer. The dye functionality can be incorporated in the monomer prior to polymerization or reacted with the phenolic pendant group after polymerization.

The antireflective coating composition comprises the polymer of the instant invention and a suitable solvent or mixtures of solvents. Other components may be added to enhance the performance of the coating, e.g. monomeric crosslinking agents, monomeric dyes, lower alcohols, additives to promote crosslinking, surface levelling agents, adhesion promoters, antifoaming agents, etc. Examples of crosslinking agents include, but are not limited to, melamines, glycoluril, hydroxy alkyl amides, epoxy and epoxy amine resins, blocked isocyanates, and divinyl monomers. Additives to promote crosslinking that can be added to the antireflective coating solution containing crosslinking agents are acids, such as p-toluene sulfonic acid, and latent acids, such as, 2,1,4- or 2,1,5- diazo naphthoquinones. Monomeric dyes may also be added to the antireflective coating, examples of which are sudan orange, 2,4-dinitronaphthol, curcumin, coumarins and others.

The absorption of the antireflective coating can be optimized for a certain wavelength or ranges of wavelengths by the suitable choice of substituents on the dye functionality. Using substituents that are electron-withdrawing or electron donating generally shifts the absorption wavelength to longer or shorter wavelengths respectively. In addition, the solubility of the antireflective polymer in a particularily prefered solvent can be adjusted by the appropriate choice of substituents on the monomers.

The polymer of the antireflective coating composition is present in the range of about 1% to about 30% by total weight of solution. The exact weight used is dependent on the molecular weight of the polymer and the film thickness of the coating desired. Typical solvents, used as mixtures or alone, that can be used are PGME, PGMEA, EL, cyclopentanone, cyclohexanone, and gamma butyrolactone, but PGME, PGMEA and EL or mixtures thereof are preferred. Solvents with a lower degree of toxicity, good coating and solubility properties are generally preferred. Another embodiment of the invention is a polymeric composition that is soluble in water or water and lower alcohols, ketones or esters that are miscible with water. Examples of lower alcohols or esters are ethanol, isopropyl alcohol, butyl acetate and acetone.

Since the antireflective film is coated on top of the substrate and is further subjected to dry etching, it is envisoned that the film is of sufficiently low metal ion level and purity that the properties of the semiconductor device are not adversely effected. Treatments such as passing a solution of the polymer through an ion exchange column, filtration, and extraction processes can be used to reduce the concentration of metal ions and to reduce particles.

The antireflective coating composition is coated on the substrate using techniques well known to those skilled in the art, such as dipping, spincoating or spraying. The film thickness of the antireflective coating ranges from about 0.1 $\mu$m (micrometer) to about 1 $\mu$m (micrometer). The coating is further heated on a hot plate or convection oven to remove any residual solvent and induce crosslinking if desired, and insolubilizing the antireflective coatings to prevent intermixing between the antireflective coating and the photoresist.

Photoresists coated over the antireflective film can be any of the types used in the semiconductor industry provided the sensitivity of the photoactive compound in the photoresist matches that of the antireflective coating.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of resists typically ranges from about 350 nm to 440 nm.

Photoresists sensitive to short wavelengths, between about 180 nm and about 350 nm can also be used. These resists, sensitive around 248 nm, normally comprise polyhydroxystyrene or substituted polyhydroxystyrene derivatives, a photoactive compound, and optionally a solubility inhibitor. The following references exemplify the types of photoresists used and are incorporated herein by reference, U.S. Pat. No. 4,491,628, U.S. Pat. No. 5,069,997 and U.S. Pat. No. 5,350,660. Similarly, resists sensitive around 193 nm, can also be used.

When used as a bottom antireflective coating composition, the composition is used to form a film on the substrate and heated on a hotplate or convection oven at a sufficiently high temperature for sufficient length of time to remove the coating solvent, and crosslink the polymer if necessary, to a sufficient extent so that the film is not soluble in the coating solution of the photoresist or in the aqueous alkaline developer. An edge bead remover may be applied to clean the edges of the substrate using processes well known in the art. The preferred range of temperature is from about 70° C. to about 250° C. If the temperature is below 70° C. then insufficient loss of solvent or insufficient amount of crosslinking takes place, and at temperatures above 250° C. the polymer may become chemically unstable. A film of photoresist is then coated on top of the antireflective coating and baked to substantially remove the photoresist solvent. The photoresist is imagewise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the antireflective film, with the remaining photoresist acting as an etch mask.

An intermediate layer may be placed between the antireflective coating and the photoresist to prevent intermixing, and is envisioned as lying within the scope of this invention. The intermediate layer is an inert polymer cast from a solvent, where examples of the polymer are polysulfone and polyimides.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Diazotization Reaction

4-Aminoacetanilide (0.035 mol, 5.25 g) was mixed with 17.5 ml of 6 N HCl at room temperature for 30 minutes and then cooled to 0° C. To this suspension solution was added dropwise cold isobutyl nitrite (0.039 mol, 4.02 g). The solution was stirred at 0–5° C. for one hour in the presence of excess nitrite indicated by the dark color of potassium iodide(KI)-starch paper. The excess nitrite was then neutralized with 1 ml of 10 wt % aqueous sulfamic acid and the diazonium salt solution was kept at 0° C. for the coupling reaction.

Coupling Reaction

To a cooled 200 ml of tetrahydrofuran (THF) containing 7.70 g (0.035 mol) poly 4-hydroxystyrene-co-methyl methacrylate (PHS-MMA), 10 ml of 10% sodium hydroxide and 100 ml water were added. The PHS-MMA was precipitated first and then redissolved in the THF/water mixed solvents. The pH of the solution was about 13.5. The diazonium salt solution formed above was added dropwise to the PHS-MMA solution at less than 10° C. while the pH was maintained at 10.8–13.5 by adding a 25% aqueous tetramethyl ammonium hydroxide (TMAH) solution. After stirring at 10° C. for one hour, the polymer was precipitated out of 800 ml of water containing 10 ml of concentrated HCl, filtered, and dried in a vacuum oven. The UV-Visible spectrograph of the reacted polymer in ethyl lactate showed $\lambda$max at 358 nm.

EXAMPLE 2

Diazotization Reaction

Ethyl 4-aminobenzoate (0.035 mol, 5.78 g) was mixed with 17.5 ml of 6 N HCl at room temperature for 30 minutes and then cooled to 0° C. To this suspension was added dropwise cold isobutyl nitrite (0.039 mol, 4.02 g). The solution was stirred at 0–5° C. for one hour in the presence of excess nitrite indicated by the dark color of KI-starch paper. The excess nitrite was then neutralized with 1 ml of 10 wt % aqueous sulfamic acid and the diazonium salt solution was kept at 0° C. for the coupling reaction.

Coupling Reaction

To a cooled 100 ml of THF containing 7.70 g (0.035 mol) PHS-MMA, was added about 5 ml of 10% sodium hydroxide and 50 ml water. The PHS-MMA was precipitated first and then redissolved in the THF/water mixed solvents. The pH of the solution was about 13. The diazonium salt solution formed above was added dropwise to the PHS-MMA solution at less than 10° C. while the pH was maintained at 10.0–10.5 by adding TMAH (25% in water). Additional 80 ml of THF was added during the reaction and the reaction mixture was separated into two layers. After stirring at 10° C. for one and a half hour, the pH was adjusted to 1.3 by adding concentrated HCl. The polymer was then precipitated out of 1600 ml of water, filtered, and dried in a vacuum oven. The UV-Visible spectograph of the reacted polymer in EL showed $\lambda$max at 331 nm.

EXAMPLE 3–9

In Table 1 are listed the PHS-MMA based azo dyes synthesized using the general preparation procedures described in Examples 1 and 2 and the $\lambda$max's for these dyes.

TABLE 1

| Example | Starting Aniline | λmax (nm) |
|---|---|---|
| 3 | 1-Amino-4-naphthalene sulfonic acid | 380 |
| 4 | 2-Aminoterephthalic acid | 330 |
| 5 | 4-Aminoacetophenone | 335 |
| 6 | 4-Anisidine | 354 |
| 7 | N-(2,4-Dinitrophenyl)-1,4-phenylenediamine | 303 |
| 8 | 2-Amino-4-(ethyl sulfonyl)phenol | 389 |
| 9 | 4-Nitroaniline | 399 |

EXAMPLE 10

Diazotization Reaction

Sulfanilic acid (0.05 mol, 8.66 g) was dissolved in 18.2 ml of 25% aqueous TMAH and cooled to 0–5° C. To this solution was added 7.0 ml of cold t-butyl nitrite (0.06 mol), followed by slow addition of 6 N HCl (0.10 mol, 16.7 ml). The resultant diazonium salt was suspended in the solution, stirred for one hour, and then kept at 0° C. for the coupling reaction.

Coupling Reaction

To a solution of PHS-MMA (0.05 mol, 11.0 g) in 50 ml THF and 50 ml water was added 30 ml of 25% TMAH in water. The PHS-MMA was precipitated initially and then slowly redissolved. The pH of the solution was about 14. The diazonium salt solution formed above was added slowly to the PHS-MMA solution at less than 10° C. Additional 13 ml of TMAH solution were added during the reaction to maintain the pH at about 10–11 and at the end of the reaction the pH was adjusted to 7.5. After stirring at 10° C. for one hour, the polymer was precipitated in 1000 ml ethanol and filtered. The UV-Visible spectrograph of the polymer in water showed a λmax of 330 nm.

EXAMPLE 11

Diazotization Reaction

4-Aminobenzoic acid (0.10 mol, 13.7 g) was suspended in 41.7 ml of 6 N HCl at room temperature for 30 minutes and then cooled to 0° C. To this suspension was added dropwise cold t-butyl nitrite (0.11 mol, 12.9 ml). The reaction was stirred at 0–5° C. for one hour. The diazonium salt dissolved in water to give a clean solution which was kept at 0° C. for the coupling reaction.

Coupling Reaction

To a solution of PHS-MMA (0.10 mol, 22.0 g) in 100 ml THF and 50 ml water was added 50 ml of 25% TMAH in water. The PHS-MMA was precipitated immediately and then slowly redissolved. The pH of the solution was about 14. The diazonium salt solution formed above was added slowly to the PHS-MMA solution at less than 10° C. while the pH was maintained at 10–11 by adding additional 25% aqueous TMAH. After stirring at 10° C. for two hours, the polymer was precipitated in 1300 ml of 30% ethanol, filtered, and dried in a vacuum oven. The UV-Visible spectrograph of the polymer in ethyl lactate showed a λmax at 330 nm.

EXAMPLE 12

Diazotization Reaction

To 50 ml of water was added in sequence 3-amino-4-hydroxybenzenesulfonic acid monohydrate (0.05 mol, 10.30 g), TMAH (25% in water, 0.05 mol, 18.2 ml), and sodium nitrite (0.06 mol, 4.07 g). The solution was cooled to 0° C. and then added slowly to a cold 6 N HCl solution (0.10 mol, 16.7 ml). After stirring at 0–5° C. for one hour, sulfamic acid solution was added to neutralize the excess nitrite. The diazonium salt solution was kept at 0° C. for the coupling reaction.

Coupling Reaction

To a solution of PHS-MMA (0.05 mol, 11.0 g) in 100 ml ethanol and 100 ml water was added 25 ml of 25% TMAH in water. The PHS-MMA was precipitated initially and then slowly redissolved. The pH of the solution was about 15. The diazonium salt solution formed above was added slowly to the PHS-MMA solution at less than 10° C. The reaction mixture was allowed to stir at 10° C. for an additional hour. The UV-Visible spectrograph of the polymer in water showed a λmax of 367 nm.

EXAMPLE 13

4.29 g of the polymeric dye described in Example 1 was dissolved in 64.90 g of EL. To this was added 0.65 g of CYMEL® 303, a crosslinking agent (available from Cytec Industries Inc.) and 0.08 g of Cycate® 296-9, an organic acid (available from Cytec Industries Inc.). The solution was filtered through 0.2 μm (micrometer) polytetrafluoroethylene (PTFE) filter, spin coated on several 10.16 cm (4") silicon wafers to give an uniform coating, and baked on a hot plate at 175° C. for 60 seconds. The coated wafers were then immersed in PGMEA and EL separately for 20 seconds and in AZ® 300 MIF TMAH developer (available from Hoechst Celanese Corporation) for 40 seconds. After spin drying, no film loss was observed in any of these cases.

EXAMPLE 14

To a solution of 4.00 g of the polymeric dye, described in Example 2, in 53.07 g of PGMEA was added 0.41 g of CYMEL® 303, a crosslinking agent (available from Cytec Industries Inc.) and 0.048 g of Cycate® 600, an organic acid (available from Cytec Industries Inc.). The solution was filtered with 0.2 μm (micrometer) PTFE filter, spin coated on several 10.16 cm (4") silicon wafers to give an uniform coating, and baked on a hot plate at 175° C. for 60 seconds. The coated wafers were then immersed in PGMEA and EL separately for 20 seconds and in AZ® 300 MIF TMAH developer (available from Hoechst Celanese Corporation) for 40 seconds. After spin drying no film loss was observed in any of these cases.

EXAMPLE 15

The dyed polymer solutions described in Examples 13 and 14 were spin coated on 10.16 cm (4") silicon wafers, then baked on a hot plate at 170° C. for 60 seconds to achieve a thickness of 2000 Å. The coated wafers were subsequently spin coated with 5000 Å of AZ® 7805 photoresist (available from Hoechst Celanese Corporation, 70 Meister Ave., Somerville, N.J. 08876) and baked at 90° C. on a hot plate for 60 seconds. A 10.16 cm (4") silicon wafer coated with 5000 Å AZ® 7805 photoresist was baked at 90° C. on a hot plate for 60 seconds and used as the reference. These wafers were imagewise exposed with a NIKON® 0.54 NA i-line stepper using a reticle with various line sizes from 0.2–1.2 μm (micrometer) and exposed using a 15×21 focus-exposure matrix with dose increments of 2 mJ/cm$^2$ and focus increments of 0.2 μm (micrometer). The exposed wafers were baked at 110° C. for 60 seconds and puddle developed with AZ® 300 MIF TMAH developer on an Optitrack® coating track for 35 seconds. The resist pattern generated on these wafers was evaluated by a Hitachi® S-4000 field emission scanning electron microscope. Table 2 shows the comparison of AZ® 7805 photoresist with the antireflective coatings of the present invention against AZ® 7805 photoresist without the antireflective coating (A.R.C.) on bare silicon wafer.

TABLE 2

| Sample | DTP (mJ/cm2) | Resolution | Standing wave |
| --- | --- | --- | --- |
| Example 13 | 170 | 0.32 μm | No |
| Example 14 | 152 | 0.30 μm | No |
| No ARC | 195 | 0.38 μm | Severe |

DTP is dose to print.

The samples with the antireflective coatings of the present invention clearly show better resolution, suppress the standing waves and maintain comparable photosensitivity.

EXAMPLE 16
Swing Ratio Reduction Test

The swing ratio of a photoresist is closely related to the linewidth variation of the photoresist pattern over a highly reflective substrate or topography commonly encountered in semiconductor device manufacturing. The lower the swing ratio, the better the linwidth control over reflective substrate or topography. The swing ratio was calculated using the equation:

Swing Ratio=(Emax−Emin)/((Emax+Emin)/2)

where Emax and Emin correspond to the dose-to-clear a resist film thickness at the maximum and minimum on a swing curve. The swing curve was generated by ploting the dose required to clear a resist film after developement as a function of the resist thickness.

Several 10.16 cm (4") wafers were coated with the antireflective coating from Examples 13 and 14 and baked at 170° C. for 60 seconds, then coated with AZ® 7805 photoresist on a MTI-Flexifab® coater using a soft bake temperature of 90° C. for 60 seconds to give thickness from 0.5 μm (micrometer) to 0.9 μm (micrometer). These wafers were imagewise exposed with a NIKON® 0.54 NA i-line stepper using clear quartz as the reticle and a program that directed the stepper to print a 11×11 exposure matrix with dose increments of 2 mJ/cm². The exposed wafers were then baked at 110° C. for 60 seconds and puddle developed with AZ® 300 MIF TMAH developer on an Optitrack® coating track for 35 seconds. The minimum dose required to clear the film was plotted as a function of the corresponding resist thickness. A sinusoidal curve was obtained and referred to as the swing curve.

The Swing ratio of each A.R.C. was calculated by the equation described above. The % swing reduction is determined by the following equation:

$$\% \text{ swing reduction} = \frac{(\text{swing ratio of AZ®7800}-\text{swing ratio of AZ®7800 on A.R.C.})}{(\text{swing ratio of AZ®7800})}$$

TABLE 3

| A.R.C. Polymer | % Swing Reduction |
| --- | --- |
| No A.R.C. | 0 |
| Example 13 | 88.87 |
| Example 14 | 90.26 |

It can be clearly demonstrated from Table 3 that the antireflective coatings of the present invention effectively reduce the swing of the photoresist tested.

EXAMPLE 17

To a solution of 2.29 grams of the polymeric dye, from Example 10, in 43.0 g of water was added 1.14 g of CYMEL® 373, a crosslinking agent (available from Cytec Industries Inc.) and 0.16 g of Cycate® 600, an organic acid (available from Cytec Industries Inc.). The solution was filtered with 0.2 μm (micrometer) nylon filter, spin coated on a 10.16 cm (4") silicon wafer to give an uniform coating, and baked on a hot plate at 200° C. for 60 seconds. The coated wafers were then immersed in PGMEA and EL separately for 20 seconds and in AZ® 300 MIF TMAH developer (available from Hoechst Celanese Corporation) for 40 seconds. After spin drying, no film loss was observed.

EXAMPLE 18

Several 10.16 cm (4") silicon wafers were primed with AZ® 300 MIF TMAH developer (available from the Hoechst Celanese Corporation, AZ Photoresist Products, 70 Meister Ave, Somerville N.J. 08876, U.S.A.) and then rinsed with deionized water. The aqueous solution of the ARC polymer described in Example 17 was spin coated on these developer primed 10.16 cm (4") wafers and baked on a hot plate at 200° C. for 120 seconds to give a thickness of 2000 Å. The wafers were then coated with with AZ® 7805 photoresist (available from Hoechst Celanese Corporation, 70 Meister Ave., Somerville, N.J. 08876) and baked using a temperature of 90° C. for 60 seconds to give photoresist film thicknesses from 0.3 to 0.5 μm (micrometer). These wafers were imagewise exposed with a NIKON® 0.54 NA i-line stepper using a clear quartz reticle and a program that directed the stepper to print a 11×11 exposure matrix with dose increments of 2 mJ/cm². The exposed wafers were baked at 110° C. for 60 seconds and puddle developed with AZ® 300 MIF TMAH developer for 35 seconds. The minimum dose required to clear the film was defined as the dose-to-clear (Eo). When Eo was plotted as a function of the corresponding resist thickness, a sinusoidal curve, called a swing curve, was obtained.

The swing ratios of AZ® 7805 photoresist with and without the ARC polymer were measured as described in Example 16 and the results are given in the following table.

TABLE 4

| Sample | Swing Ratio | % Swing Reduction |
| --- | --- | --- |
| AZ ® 7805 | 29.02% | 0 |
| ARC of Ex. 17 and AZ ® 7805 | 11.11% | 61.7% |

It is clearly demonstrated that the antireflective coating of the Example 17 effectively reduces the swing ratio by 61.7%.

EXAMPLE 19

A silicon wafer is coated with a photoresist solution, e.g. AZ® 7805 photoresist and baked using a temperature of 90° C. for 60 seconds to give a photoresist film thickness of about 0.5 micrometer. An aqueous coating of the novel polymer is coated on top of the photoresist. The wafer is then exposed with an i-line stepper through a mask to give the desired pattern. The substrate is then baked at 110° C. for 60 seconds and developed with AZ® 300 MIF TMAH developer for 35 seconds.

This example illustrates the use of the novel polymer coating as a dyed top antireflective coating.

We claim:

1. A polymer which may be suitable for use as an antireflecting coating in photolithography, comprising:

a) at least one dye unit having the structure:

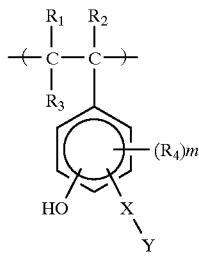

where, $R_1$–$R_4$ are independently hydrogen, alkyl, alkoxy, halo, cyano, divinylcyano, alkyl ether, aryl, aralkyl, amino, hydroxy, fluoroalkyl, nitro, amide, alkyl amide, sulfonic acid, sulfonate ester, carboxylic acid, carboxylic ester or alkali salts of carboxylic or sulfonic acids;

X is R'C=CR', R' C=N or N=CR', where R' is H or alkyl;

Y is aryl, aralkyl, heterocyclic or alkyl;

m=1–3; and b) at least one comonomer unit of the formula,

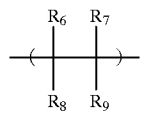

where, $R_6$–$R_9$ are independently hydrogen, alkyl, alkoxy, halo, alkyl ether, amino, hydroxy, fluoroalkyl, amide, alkyl amide, carboxylic acid, carboxylic ester, sulfonic acid, sulfonic ester, alkali salts of carboxylic acid, alkali salts of sulfonic acid, crosslinking group or $R_8$ and $R_9$ combined to form an anhydride group.

2. The polymer according to claim 1, where the comonomer unit has the structure:

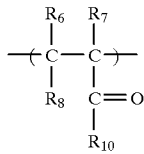

where, $R_6$–$R_8$ and $R_{10}$ are independently hydrogen, alkyl, alkoxy, halo, alkyl ether, amino, hydroxy, fluoroalkyl, amide, alkyl amide, carboxylic acid, carboxylic ester, sulfonic acid, sulfonic ester, alkali salts of carboxylic acid, the alkali salts of sulfonic acid or crosslinking group.

3. A polymer which may be suitable for use as an antireflecting coating in photolithography, comprising:

a) at least one dye unit having the structure:

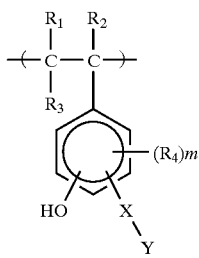

where, $R_1$–$R_4$ are independently hydrogen, alkyl, alkoxy, halo, cyano, divinylcyano, alkyl ether, aryl, aralkyl, amino, hydroxy, fluoroalkyl, nitro, amide, alkyl amide, sulfonic acid, sulfonate ester, carboxylic acid, carboxylic acids ester or alkali salts of carboxylic or alkali salts of sulfonic acids;

X is N=N,

Y is alkoxy carbonylphenyl, acetylphenyl, acetamidophenyl, alkoxyphenyl, N-(2,4-dinitrophenyl) aminophenyl, 2-hydroxy-5-(ethyl sulfonyl)phenyl, hydroxysulfophenyl, alkali salts of hydrosulfophenyl, sulfonaphthalenyl or the alkali salts of sulfonaphthalenyl, m=1–3; and b) at least one comonomer unit of the formula,

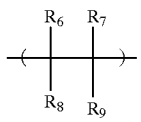

where, $R_6$–$R_9$ are independently hydrogen, alkyl, alkoxy, halo, alkyl ether, amino, hydroxy, fluoroalkyl, amide, alkyl amide, carboxylic acid, carboxylic ester, sulfonic acid, sulfonic ester, alkali salts of carboxylic acid or alkali salts of sulfonic acid, crosslinking group or $R_8$ and $R_9$ combined to form an anhydride group.

4. The polymer according to claim 1 or 3, wherein the polymer has a weight average molecular weight in the range of about 2,500 to about 1,000,000.

5. The polymer according to claims 1 or 3, wherein the concentration of each metal ion is less than 50 ppb.

6. The polymer according to claims 1 or 3, wherein the polymer further comprises one or more vinyl monomers that are nonabsorbing and nonaromatic.

7. The polymer according to claims 1 or 3, wherein the polymer further comprises one or more vinyl monomers that contain a crosslinking group.

* * * * *